United States Patent
Visser et al.

(10) Patent No.: US 11,538,605 B2
(45) Date of Patent: Dec. 27, 2022

(54) SHIELDING TAPE WITH FEATURES FOR MITIGATING MICRO-FRACTURES AND THE EFFECTS THEREOF

(71) Applicant: PCT International, Inc., Tempe, AZ (US)

(72) Inventors: Leonard Visser, Huntsville, AR (US); Timothy L. Youtsey, Tempe, AZ (US); Walter B. Melton, Glendale, AZ (US)

(73) Assignee: PCT International, Inc.

( * ) Notice: Subject to any disclaimer, the term of this patent is extended or adjusted under 35 U.S.C. 154(b) by 0 days.

(21) Appl. No.: 17/240,031

(22) Filed: Apr. 26, 2021

(65) Prior Publication Data

US 2021/0241939 A1 Aug. 5, 2021

Related U.S. Application Data

(62) Division of application No. 16/256,094, filed on Jan. 24, 2019, now abandoned.

(60) Provisional application No. 62/621,905, filed on Jan. 25, 2018, provisional application No. 62/621,901, filed on Jan. 25, 2018.

(51) Int. Cl.
*H01B 7/22* (2006.01)
*H01B 7/18* (2006.01)
*H05K 9/00* (2006.01)
*H01B 11/10* (2006.01)

(52) U.S. Cl.
CPC ............ *H01B 7/22* (2013.01); *H01B 7/1895* (2013.01); *H05K 9/0098* (2013.01); *H01B 11/1008* (2013.01)

(58) Field of Classification Search
CPC .......... H01B 7/22; H01B 7/26; H01B 7/1895; H01B 7/184; H01B 7/1845; H01B 11/1008; H05K 9/0098
See application file for complete search history.

(56) References Cited

U.S. PATENT DOCUMENTS

| | | | |
|---|---|---|---|
| 4,678,699 A | 7/1987 | Kritchevsky et al. | |
| 5,573,857 A | 11/1996 | Auger | |
| 6,201,190 B1* | 3/2001 | Pope | H01B 11/1826 174/102 R |
| 8,119,906 B1* | 2/2012 | Smith | H01B 11/1008 174/36 |
| 9,481,328 B2* | 11/2016 | Yoshida | H01B 7/0045 |
| 10,102,946 B1* | 10/2018 | McNutt | H05K 9/0098 |
| 10,332,654 B2 | 6/2019 | Lawrence | |

(Continued)

*Primary Examiner* — Hoa C Nguyen
*Assistant Examiner* — Amol H Patel
(74) *Attorney, Agent, or Firm* — Thomas W. Galvani, P.C.; Thomas W. Galvani

(57) ABSTRACT

In an electronic cable, a shielding tape prevents and mitigates the creation and propagation of micro-fractures and the deleterious effects thereof. In some embodiments, the shielding tape has layers which are oriented in a non-zero transverse relation with respect to each other, or have been treated to have non-zero orientations. Other embodiments include micro-fracture propagation mitigation means, such as perforations, ridges, waffling, and dimpling. In some embodiments, the layers of the shielding tape are bonded to each other with an electrically-conductive elastomeric adhesive. In other embodiments, the shielding tape is wrapped around a cable's dielectric and form an overlap gap, which is filled by an electrically-conductive elastomeric adhesive.

3 Claims, 9 Drawing Sheets

(56) References Cited

U.S. PATENT DOCUMENTS

| | | |
|---|---|---|
| 10,593,502 B1 * | 3/2020 | Lanoe ................ H01H 85/0241 |
| 2003/0102147 A1 | 6/2003 | Perelman et al. |
| 2011/0011639 A1 | 1/2011 | Visser |
| 2015/0060110 A1 | 3/2015 | Merz et al. |
| 2019/0162922 A1 | 5/2019 | Wen et al. |

* cited by examiner

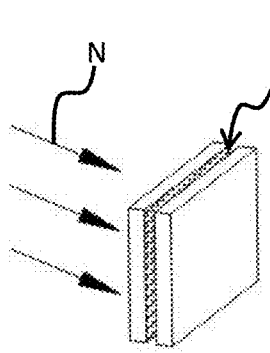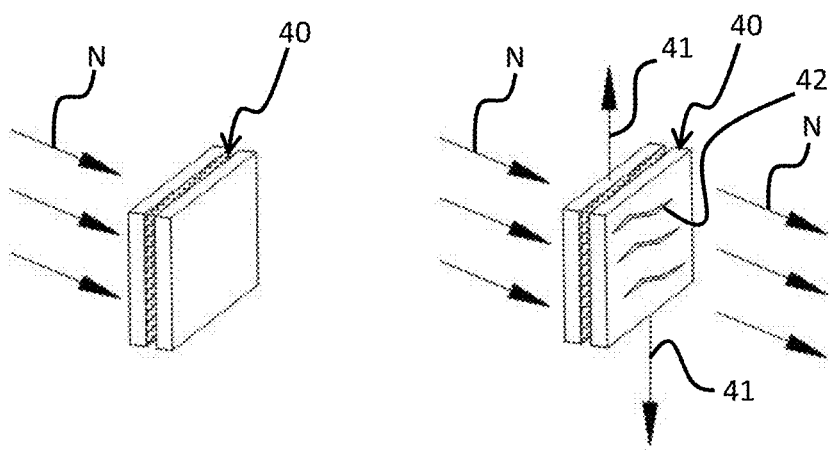
FIG. 4A  FIG. 4B
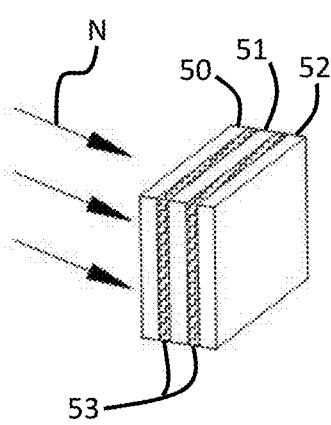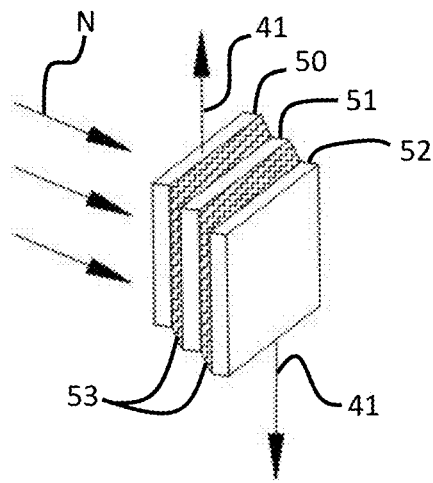
FIG. 4C  FIG. 4D
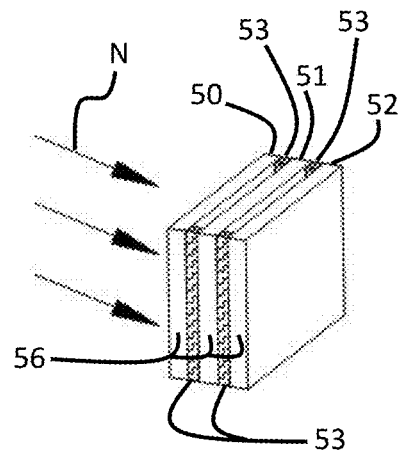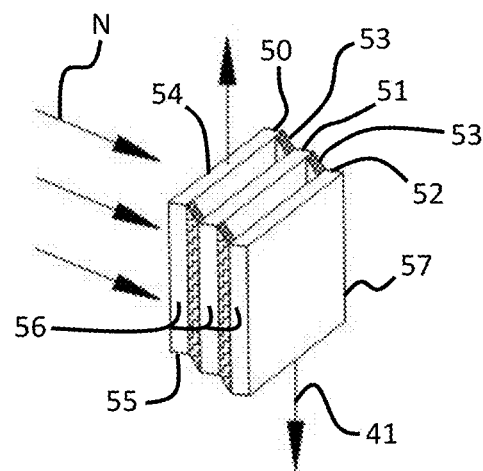
FIG. 4E  FIG. 4F

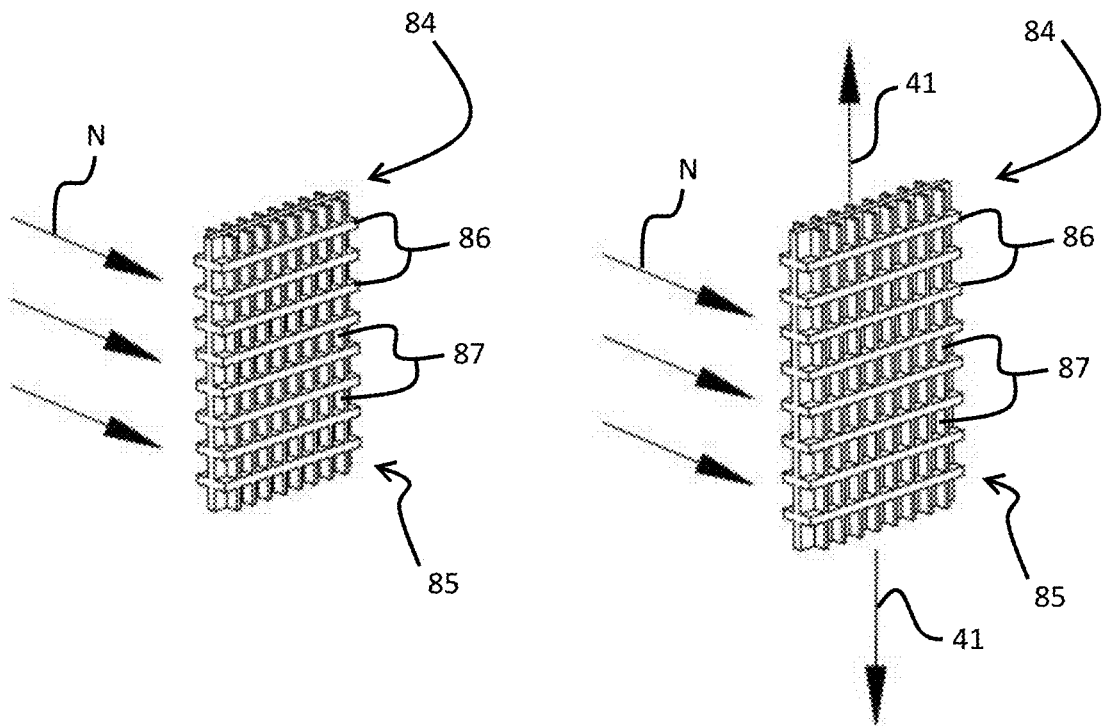
FIG. 6E
FIG. 6F
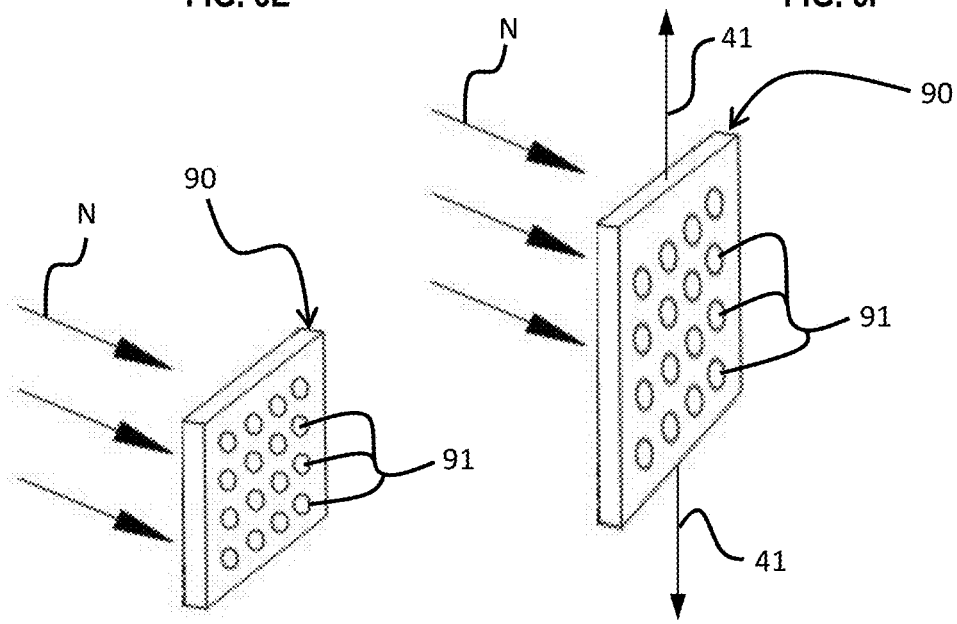
FIG. 6G
FIG. 6H

SHIELDING TAPE WITH FEATURES FOR MITIGATING MICRO-FRACTURES AND THE EFFECTS THEREOF

CROSS-REFERENCE TO RELATED APPLICATIONS

This application is a divisional of and claims the benefit of U.S. patent application Ser. No. 16/256,094, filed Jan. 24, 2019, which claims the benefit of both U.S. Provisional Application No. 62/621,901, filed Jan. 25, 2018, and U.S. Provisional Application No. 62/621,905, filed Jan. 25, 2018, all of which are hereby incorporated by reference.

FIELD OF THE INVENTION

The present invention relates generally to electronic devices, and more particularly to shielding tape used in various cabled communication products including coaxial cable, HDMI cable, power cords, Ethernet cables, and other electronic cables and devices.

BACKGROUND OF THE INVENTION

Electronic devices and components used in and around homes and businesses produce ingress noise affecting radio-frequency ("RF") signals transmitted through nearby coaxial cables. Ingress noise can be caused by manufacturing or installation defects, by imperfections in various electronic devices or components or electronic cables, and by poor or inadequate shielding. Conventional shielding that may have once been adequate is becoming less and less effective with the continuing proliferation of electronic devices. Communication in the 5G band creates particularly insidious noise issues. Ingress noise has become a serious problem impacting signal quality in television, voice, security, and broadband services.

Shielding is used in a variety of electronic cables and devices to reduce outside electrical interference or noise that could affect an RF signal travelling through the cable or other device. The shielding also helps prevent the signal from radiating from the cable or other device and then interfering with other devices.

Conventionally, one type of shielding includes two or three shielding layers of aluminum or other shielding material (such as silver, copper, or Mu-metal) wherein each shielding layer of a laminated assembly is separated by a separating layer, such as a plastic, e.g., polyethylene terephthalate ("PET"), or a polyolefin such as polypropylene ("PP"). This type of shielding that combines layers of shielding material and separating layers is often referred to as either "foil," "laminated tape," "shielding tape," "shielding laminate tape," "laminated shielding tape" (LST), and combinations or variations thereof. In some cables, such as coaxial cables, multiple layers of shielding tape (each of which has one or more shielding layers) are employed in the cable. For example, "tri-shield" cables include an inner foil surrounded by a braid, which is in turn surrounded by an outer foil. "Quad-shield" cables include an inner foil surrounded by an inner braid, which is in turn surrounded by an outer foil, in turn surrounded by an outer braid.

Multiple layers of shielding tape, while providing better shielding performance, also add to the cost and complexity of producing the cabling. Conventional shielding tape, with only one or two shielding layers, is susceptible to the formation of micro-fractures or micro-cracks as the cable bends and flexes over time. Such micro-fractures are shown in FIGS. 1A and 1B. Micro-fractures may also be caused by the application of heat and stress to shielding tape, during the manufacturing process of a coaxial cable, as the tape is bonded to or applied over inner components of the cable such as the dielectric material. These micro-fractures and micro-cracks will allow RF signal ingress and egress. A way to mitigate the formation of the micro-fractures and micro-cracks, or a way to mitigate their effects, is needed.

SUMMARY OF THE INVENTION

In an electronic cable, a shielding tape prevents and mitigates the creation and propagation of micro-fractures and the deleterious effects thereof. In some embodiments, the shielding tape has layers which are oriented in a non-zero transverse relation with respect to each other, or have been treated to have non-zero orientations. Other embodiments include micro-fracture propagation mitigation means, such as perforations, ridges, waffling, and dimpling. In some embodiments, the layers of the shielding tape are bonded to each other with an electrically-conductive elastomeric adhesive. In other embodiments, the shielding tape is wrapped around a cable's dielectric and form an overlap gap, which is filled by an electrically-conductive or elastomeric adhesive.

The above provides the reader with a very brief summary of some embodiments discussed below. Simplifications and omissions are made, and the summary is not intended to limit or define in any way the scope of the invention or key aspects thereof. Rather, this brief summary merely introduces the reader to some aspects of the invention in preparation for the detailed description that follows.

BRIEF DESCRIPTION OF THE DRAWINGS

Referring to the drawings:

FIGS. 4A and 4B are diagrams of two bonded layers of conventional shielding tape, illustrating RF noise egress through micro-fractures;

FIGS. 4C and 4D are diagrams of two elastomerically bonded layers of shielding tape, illustrating the prevention of RF noise egress;

FIGS. 4E and 4F are diagrams of two elastomerically bonded layers of shielding tape, illustrating the prevention of RF noise egress;

FIGS. 6E and 6F are diagrams of a layer of shielding tape with waffling, preventing the development of micro-fractures when placed under stress;

FIGS. 6G and 6H are diagrams of a layer of shielding tape with dimpling, preventing the development of micro-fractures when placed under stress;

DETAILED DESCRIPTION

Figure 1A:
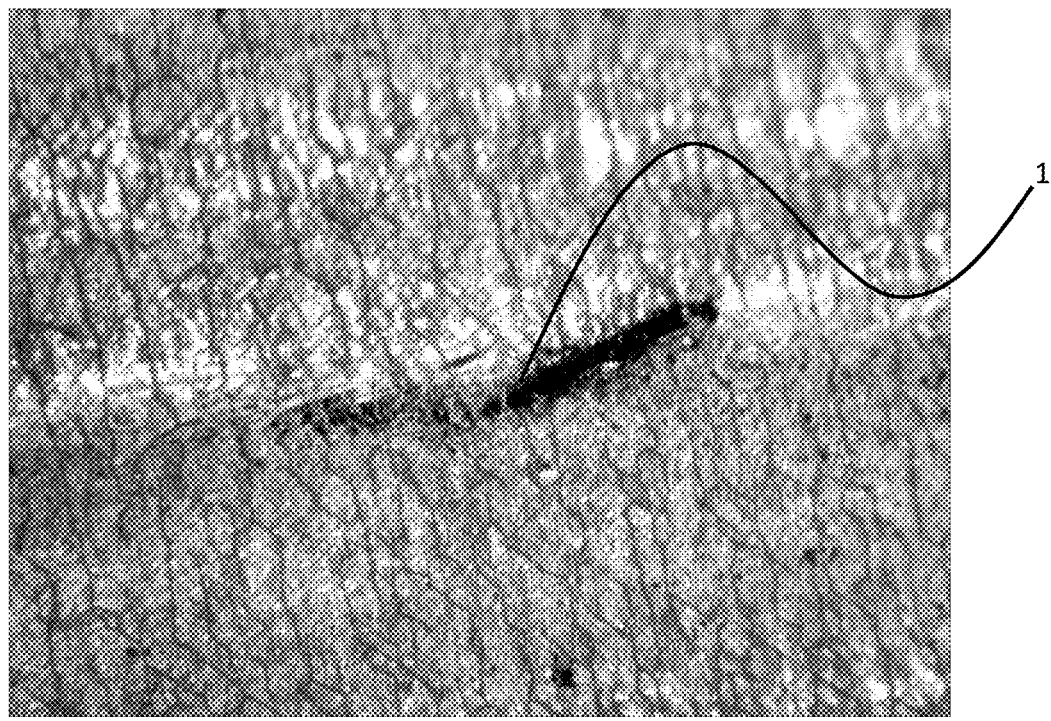
FIGS. 1A and 1B are photographs of micro-fractures in electronic cables.
Figure 1B:
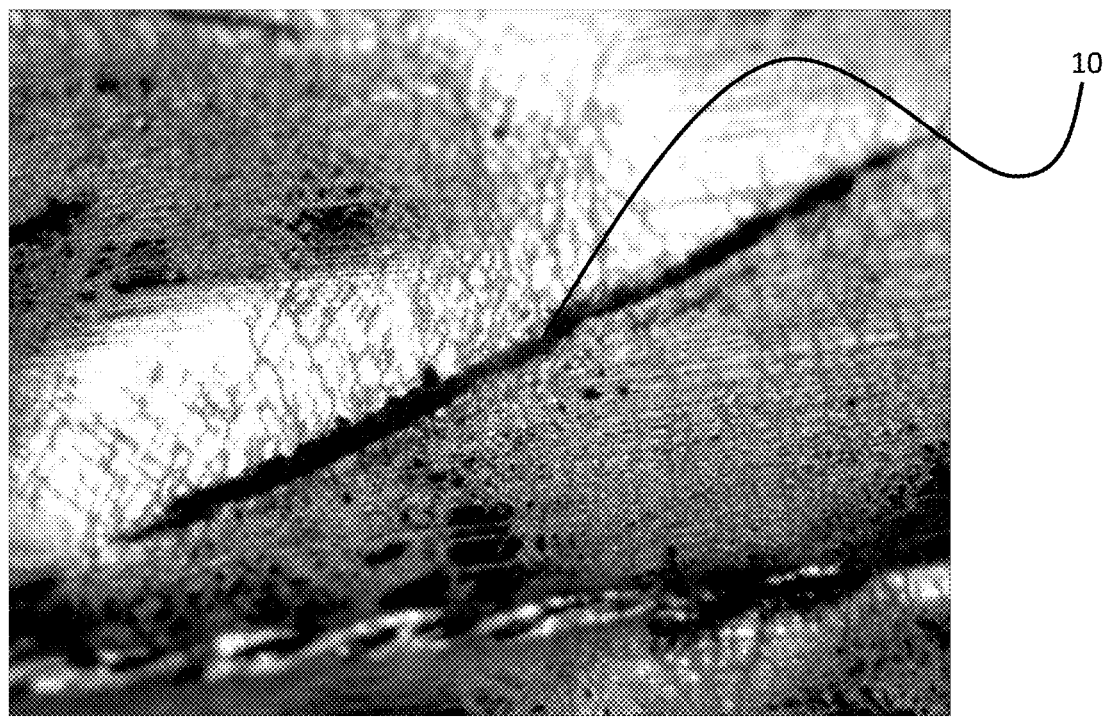

Reference now is made to the drawings, in which the same reference characters are used throughout the different figures to designate the same elements. FIGS. 1A and 1B are optical microscope photographs showing micro-fractures 10 formed through a shielding tape. These micro-fractures 10 are elongate, longer than they are wide. Micro-fractures such as these allow RF ingress and egress.

Figure 2A:
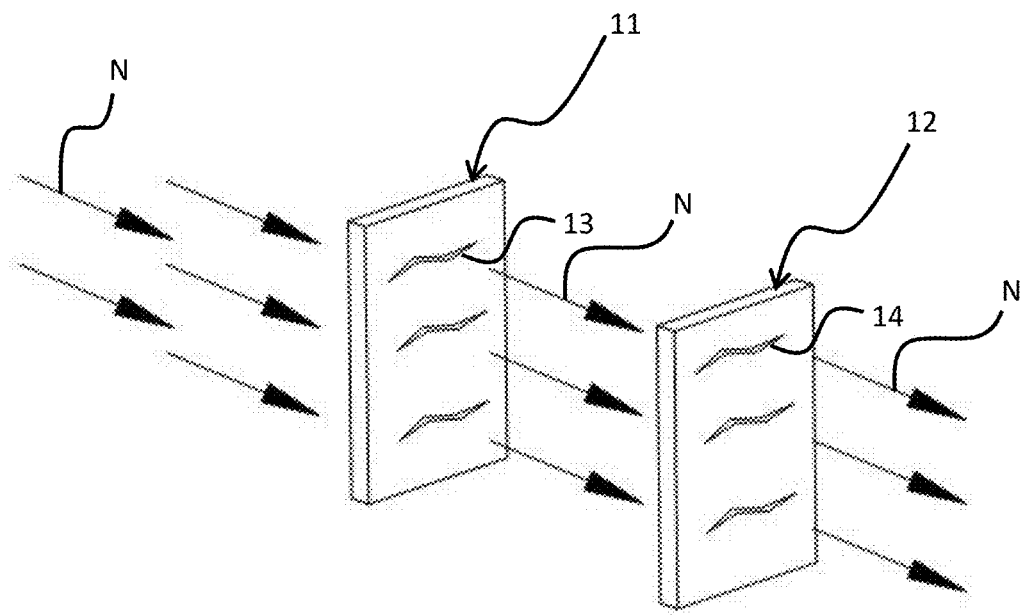
FIG. 2A is a diagram of two layers of conventional shielding tape, illustrating RF noise egress through micro-fractures.

FIG. 2A illustrates conventional laminated tape construction techniques which might lead to the creation of such micro-factures 10. FIG. 2A shows two laminated tape layers 11 and 12. The layer 11 is an inner layer and the layer 12 is an outer layer; the outer layer 12 surrounds the inner layer 11. Though one having ordinary skill in the art should understand, discussion of conventional coaxial cable construction is discussed here for the purpose of context. This discussion is not meant to limit this entire disclosure to coaxial cables; indeed, this disclosure applies to other types of electronic cables and cords as suitable. Generally, most conventional coaxial cables have a center conductor surrounded by a cylindrical dielectric. The dielectric is then encircled by the shielding tape, which may include a foil layer, a laminated shielding tape layer, a braided layer, or a combination thereof. Finally, an insulating jacket—generally a PVC jacket—surrounds the entire assembly.

The layers 11 and 12 are two layers of the shielding tape in such a conventional coaxial cable. During the manufacturing processes of these layers 11 and 12, rolling and stretching of the metal of the layers 11 and 12 results in a generally longitudinal crystal orientation. If micro-fractures later develop in the layers 11 and 12, such micro-fractures tend to be likewise oriented longitudinally. Wrapping the layers 11 and 12 onto the cable can create or enlarge the micro-fractures. FIG. 2A shows two set of micro-fractures 13 and 14 formed in the layers 11 and 12.

Frequently, micro-fractures propagate through the components of a shielding tape. This is what has occurred in FIG. 2A; it can be seen that the micro-fractures 13 and 14 are registered with each other. When the center conductor within the cable generates egress noise (indicated throughout these drawings by the reference character N), the noise N can pass through the micro-fractures 13 in the inner layer 11. When the micro-fractures 13 and 14 in both layers 11 and 12 are registered with each other, however, the noise N will pass not only through the layer 11, but also through the layer 12, thereby transmitting outside of the cable. It is noted that while the drawings generally show egress noise N as a set of arrowed lines extending out of the cable, the micro-fractures are also vulnerable to ingress noise. Ingress noise is not specifically discussed or shown here, but one having ordinary skill in the art will appreciate that it behaves similarly to egress noise N with respect to transmission through micro-fractures.

Figure 1C:
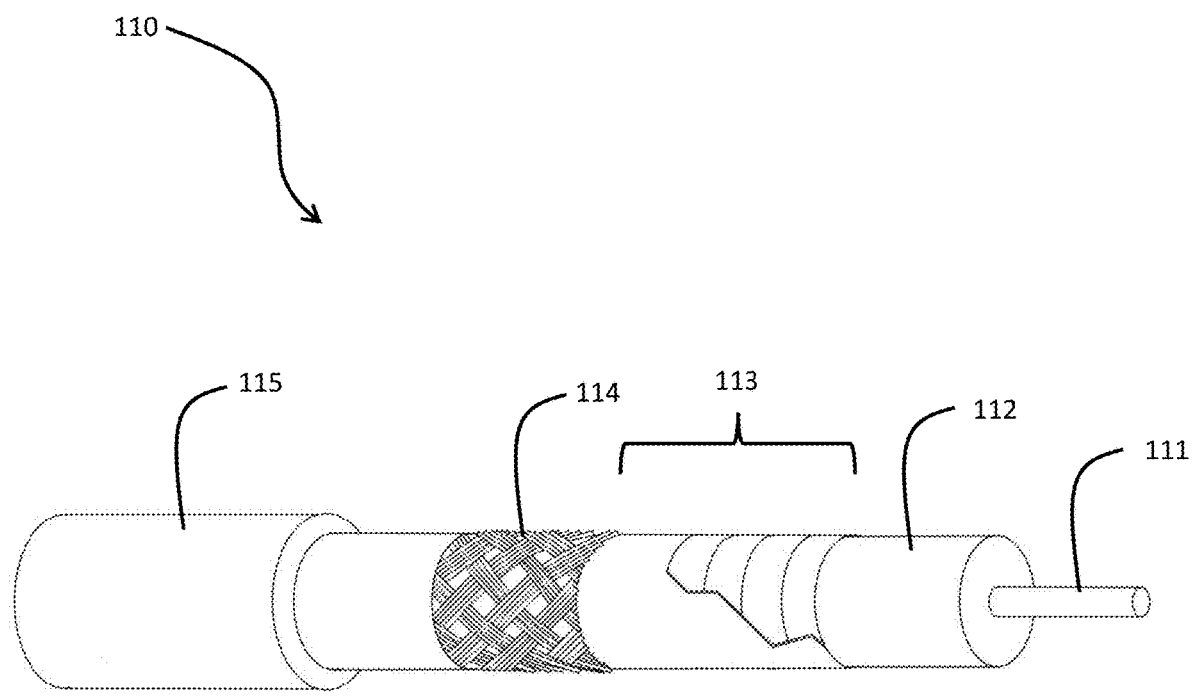
FIG. 1C is an electronic cable with a shielding tape.

FIG. 1C illustrates a coaxial cable 110 constructed with shielding tape that prevents and mitigates the formation and propagation of micro-fractures and also prevents and mitigates the deleterious effects of RF signal ingress and egress through such micro-fractures. The cable 110 has a center conductor 111, an insulating dielectric 112 surrounding the conductor 111, a shielding tape 113 with these mitigation features, a flexible braid 114 encircling the shielding tape 113, and an insulative jacket 115 surrounding everything.

The below construction methods, features, techniques, and structures apply to the shielding tape 113, mitigate micro-fracture formation and propagation, and also minimize RF signal ingress and egress. In general, improved shielding tapes are described which reduce the incidence, enlargement, and propagation of micro-fractures and micro-tears that often result from bending and flexing of cables and other devices. This not only reduces signal egress or ingress but also improves the flex life of the shielding tape, maintains electrical continuity, and minimizes performance degradation of the cable or other device over time. Furthermore, outer shielding structures, such as braids, may be eliminated, thereby eliminating the need to remove such structures when attaching a connector to the cable, and eliminating problems associated with outer shielding structures separating and interfering with connector attachment.

Figure 2B:
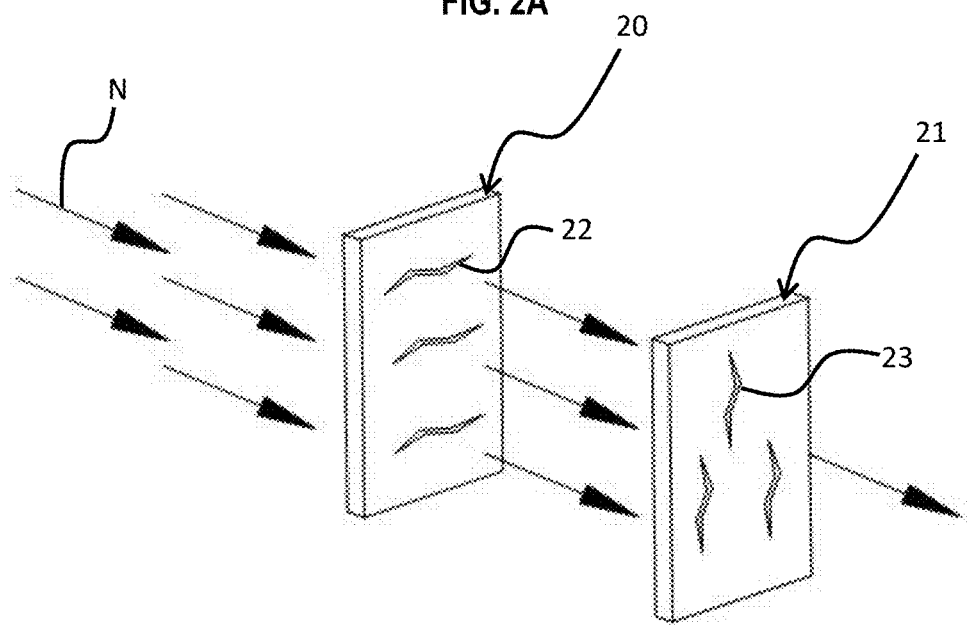
FIG. 2B is a diagram of two layers of a shielding tape, illustrating mitigation of RF noise egress through micro-fractures.

FIG. 2B illustrates a construction technique which prevents the development of registered micro-fractures in the shielding tape used for shielding, and/or reduces the incidence of micro-fractures, and minimizes the dimensions of micro-fractures. The shielding tape shown in FIG. 2B is constructed with two separate metallic layers 20 and 21 in which some of the aluminum crystal orientation of one or more of the adjoining aluminum layers is at least partially biased by a surface treatment such as burnishing. It is briefly noted here that "aluminum laminate" is sometimes used in this description to identify the shielding tape because aluminum is a common material choice for the shielding foil.

FIG. 2B shows micro-fractures 22 and 23 formed in the layers 20 and 21, respectively. As can be seen, the micro-fractures 22 and 23 are oriented transversely with respect to each other. This is because the layers 20 and 21 have been burnished differently. Burnishing is the process of rubbing or smoothing the layers 20 and 21 in a certain direction by repeatedly sliding a hard object tangentially in contact against the layers 20 and 21. As burnishing continues, the crystals in the layers 20 and 21 orient themselves consistently. This helps ensure that if a micro-fracture develops, it will develop along the orientation of the crystals. In other words, when the crystals have acquired a consistent orientation the micro-fractures are predisposed to form along that particular orientation.

The inner layer 20 is burnished in a first direction arranging the crystals into a first orientation (horizontal on the page), and the outer layer 21 is burnished in a second direction arranging the crystals into a second orientation (vertical on the page). FIG. 2B shows the first and second orientations generally as the direction of the micro-fractures 22 and 23, which are perpendicular to each other. While a perpendicular orientation may be preferable, any non-zero transverse relation is suitable. When the metallic layers 20 and 21 are joined to each other (preferably with laminate between) during manufacturing to form the shielding tape for application to the cable, the micro-fractures 22 and 23 are offset; they have a non-zero transverse orientation with respect to each other. Therefore, longitudinal tears are less likely to register with or near each other, and are thus more likely to form only small holes through the shielding tape rather than long tears. In other words, overlapping micro-fractures 22 and 23 in adjacent layers 20 and 21 form small holes rather than tears, and small holes allow less RF egress noise N to be emitted than do long tears.

While the construction technique shown in FIG. 2B does not necessarily reduce the incidence of micro-fractures, it does reduce the transmission of egress noise N by orienting the micro-fractures in an offset fashion. RF ingress and egress through the micro-fractures 22 and 23 is thus minimized, and shielding effectiveness is maintained despite the presence of the micro-fractures 22 and 23 in the individual layers 20 and 21.

Figure 3:
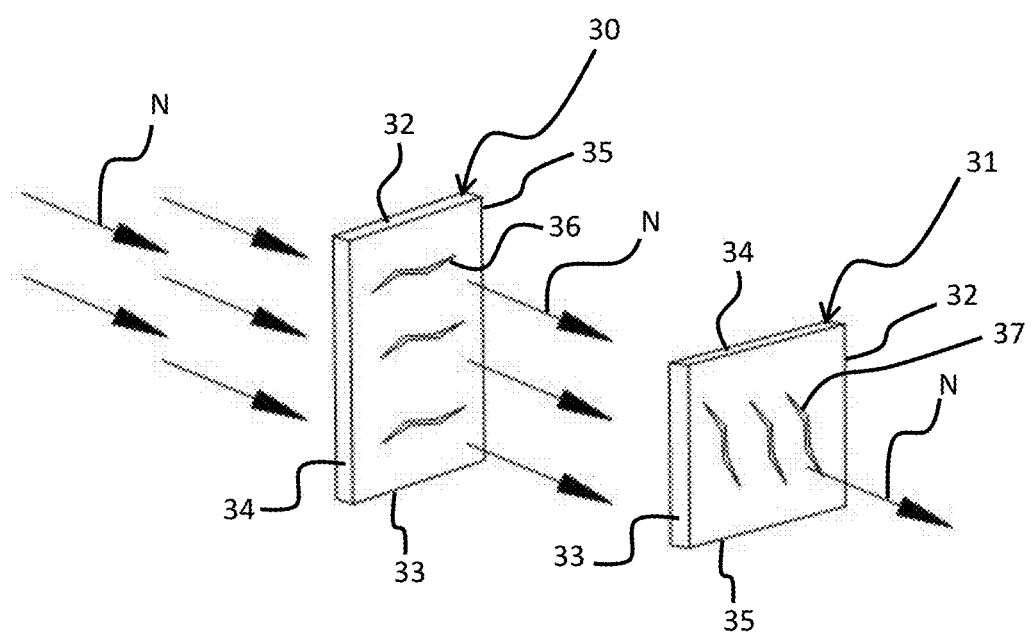
FIG. 3 is a diagram of two layers of a shielding tape, illustrating mitigation of RF noise egress through micro-fractures.

FIG. 3 illustrates another shielding tape construction technique. Two metallic layers 30 and 31 of the shielding tape each have opposed ends 32 and 33 and opposed sides 34 and 35. They also have a similar aluminum crystal orientation, namely, between the sides 34 and 35. This crystal orientation is created by burnishing or some other technique. The known consistent orientation of aluminum crystals is exploited to mitigate egress noise N transmission. Before the metallic layers 30 and 31 are joined to form the shielding tape, one of the layers 30 or 31 is rotated with respect to the other. FIG. 3B shows the outer layer 31 offset and generally perpendicular to the inner layer 30. While a perpendicular offset orientation may be preferable, any non-zero transverse relation is suitable. The layers 30 and 31 are then joined.

By offsetting or orienting the layers 30 and 31 transversely with respect to each other, shielding loss from micro-fractures is minimized. While the micro-fractures 36 and 37 may overlap with each other, they do not register, and so they can only form small holes rather than long tears. Laminating two or more such layers 30 and 31, one of which has been physically offset at any non-zero angle up to and including ninety degrees prior to lamination, minimizes the dimensions of the opening through which any RF ingress or egress can occur and thereby reduces the potential for RF signal ingress or egress through a micro-fracture of the aluminum layer.

In another method, each layer of the shielding tape is annealed prior to lamination. Under appropriate annealing procedures, aluminum crystal grain size is reduced and orientation of the crystals is randomized. If micro-fractures later occur in the presence of smaller grains and randomized crystal orientation, such micro-fractures are less likely to be parallel with or coterminous with a micro-fracture in an adjoining layer. Thus, a channel through which any ingress or egress noise must penetrate, if any such channel exists, is greatly reduced in size. Shielding from RF signal ingress or egress is thereby preserved.

Conventionally, the components of the shielding tape 40 are joined to each other with a non-elastomeric adhesive, as shown in FIG. 4A. When a stress is applied on the shielding tape 40, such as a shear stress 41, micro-fractures 42 will develop in one or both of the layers, and egress noise N will transmit through these micro-fractures 42.

FIGS. 4C and 4D show three laminated layers 50, 51, and 52 of a shielding tape with an adhesive 53 disposed therebetween. The adhesive 53 has elastomeric properties and thus permits flexing without the consequential forming of micro-fractures in the layers 50, 51, or 52. The elasticity of the adhesive 53 reduces the transmission from one layer to another of the stresses caused by bending or flexing, thereby decreasing the likelihood of the development of a micro-fracture. But, if such a micro-fracture does occur in one aluminum layer despite the elasticity of the bonding adhesive, there is less likelihood that parallel or coterminous micro-fractures will propagate or develop in the adjoining layers, and there is a greater likelihood that any micro-fracture present in one layer will be covered by or adjacent to an undamaged segment of the adjacent layer.

The adhesive 53 is applied across the entire surface of each layer 50, 51, and 52, so that bonding between two adjacent layers is made across the entirety of abutting surfaces. The shielding tape is constructed in this fashion and is then wrapped around the cable. While FIG. 4D does illustrates three layers 50, 51, and 52, it is noted that a greater or lesser number of layers may be used, depending on factors such as the performance specifications, design constrictions, and budget of the manufacturer.

FIGS. 4E and 4F show an alternate embodiment of elastomeric bonding. There, the shielding tape is still constructed from three layers 50, 51, and 52, but the adhesive 53 is applied differently. The layers 50, 51, and 52 each have opposed ends 54 and 55 and opposed sides 56 and 57. The adhesive 53, rather than being applied across an entire face of the layer, is only applied along the sides 56 and 57. No adhesive 53 is applied between the sides 56 and 57. In some embodiments, adhesive 53 is applied along the opposed ends 55 and 56.

In applications involving coaxial cable, the shielding tape is commonly manufactured in long strips, so in this particular application the bonding adhesive is preferably applied only along the longitudinal sides 56 and 57 of the layers 50, 51 and 52. Flexibility of unbonded sections of the layers 50, 51, and 52, between the sides 56 and 57, provides a measure of stress relief that reduces the likelihood of micro-fracture development in the layers 50, 51, and 52. FIGS. 4E and 4F show the application of the bonding adhesive only along the sides 56 and 57 of the layers 50, 51, and 52. When the shear stress 41 is applied, micro-fractures do not develop. Other patterns of adhesive placement may be suitable or preferable in some applications.

The above construction techniques mitigate the effects of micro-fracture incidence and propagation. Other construction techniques directly mitigate the incidence and propagation of micro-fractures. These micro-fracture propagation mitigation means or features are formed in the metallic layer of the shielding and include perforations or micro-perforations (FIGS. 5A and 5B), ridges (FIGS. 6C and 6D), waffling (FIGS. 6E and 6F), and dimpling (FIGS. 6G and 6H).

Figure 5A:
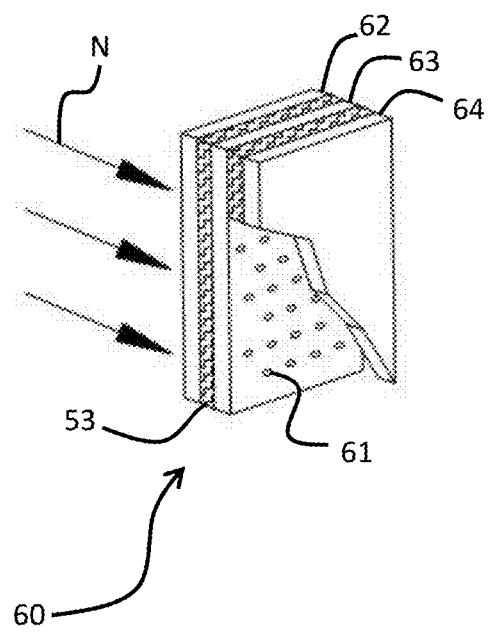
FIGS. 5A and 5B are diagrams of layers of shielding tape, at least one of which is formed with micro-perforations.
Figure 5B:
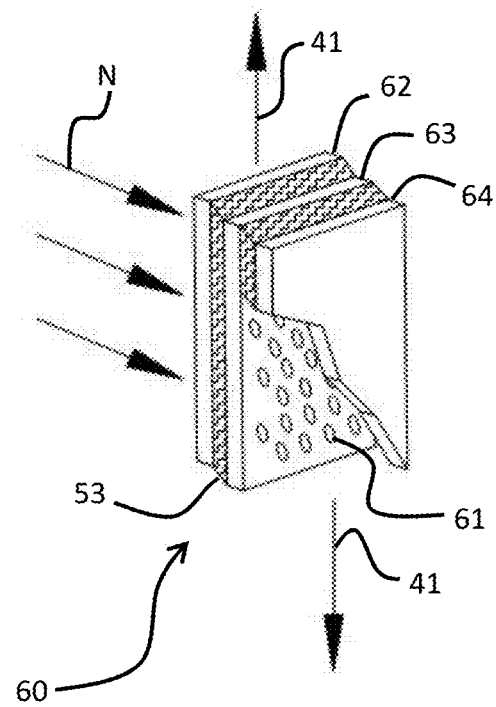

One such means of reducing the incidence of micro-fractures is with the use of an array of perforations or micro-perforations, as shown in FIGS. 5A and 5B, which show a shielding tape 60 under no stress and under shear stress 41. In this embodiment, an array of micro-perforations 61 is applied to one or more layers 62, 63, or 64 of the shielding tape 60. Such micro-perforations 61 in a layer alleviate any stresses present and decreases the likelihood that any such stresses will cause a micro-fracture. Moreover, where stresses do cause a micro-fracture, such micro-perforations 61 prevent and limit further expansion of the micro-fractures beyond the micro-perforation 61. The micro-perforations thus act as a stop to migration or extension of micro-fractures across more of the affected layer.

The micro-perforations 61 have a major dimension, which is the longest distance between two edges of a micro-perforation. The major dimension is smaller in dimension than the amplitude of the wavelength of the RF signal to be carried by the particular cable in which the shielding tape 60 is to be used. Thus, RF signals cannot pass through any one of the intact micro-perforations 61. Indeed, ingress or egress of noise from desired RF signals through a micro-perforation 61 can only occur in the event that there is a tear at a micro-perforation. Even then, the noise ingress or egress can only pass entirely through the shielding tap 60 if the adjacent layers have also been torn at micro-perforations 61 which are registered with the torn micro-perforation 61.

Because the micro-perforations 61 are very small, any ingress or egress of RF signals through the micro-perforations 61 is limited to much higher frequencies and smaller wavelengths than might otherwise leak through a larger micro-fracture. Moreover, noise ingress would be from RF signals different in wavelength from those transmitted through the cable. In other words, use of an array of micro-perforations 61 is especially suitable in applications where ingress or egress of higher frequency range RF signals is not a significant consideration and can be tolerated.

The shielding tape 60 shown in FIGS. 5A and 5B includes an array of micro-perforations 61 in which the micro-perforations 61 are arranged in rows, and the micro-perforations 61 in each row are offset horizontally from those in the row above and below. The micro-perforations 61 preferably have a circular shape, with their major dimension being the diameter of that circular shape, but in other embodiments may have other shapes whose major dimension is smaller than the wavelength of the RF noise, especially of RF noise in the 5G spectrum. Preferably, the major dimension is smaller than approximately 12 millimeters to mitigate RF frequencies around 24 GHz. More preferably, the major dimension is smaller than approximately 3.5 millimeters to mitigate RF frequencies around 86 GHz. Still more preferably, the major dimension is smaller than approximately 3 millimeters to mitigate RF frequencies around 95 GHz. In the array, the micro-perforations 61 are preferably spaced apart by at least the major dimension.

As can be seen in FIGS. 5A and 5B, the shielding tape 60 not only has the micro-perforations 61, but its layers 62, 63, and 64 are joined by the elastomeric adhesive 53. When the shear stress 41 is applied, the layers 62, 63, and 64 stretch along the direction of the shear stress 41, the adhesive 53 elastically deforms, and the micro-perforations 61 deform to acquire an elongated shape. When the shear stress 41 is released, the micro-perforations return to their original shape, as in FIG. 5A.

Figure 6A:
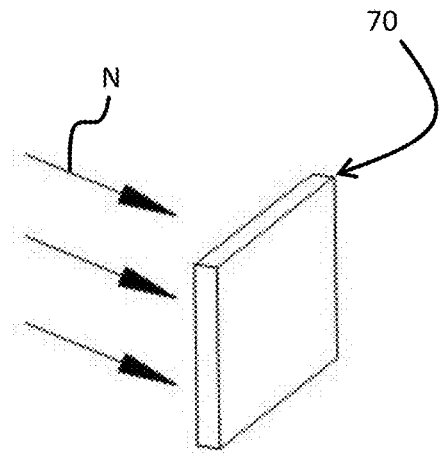
FIGS. 6A and 6B are diagrams of a layer of conventional shielding tape developing micro-fractures when placed under stress.
Figure 6B:
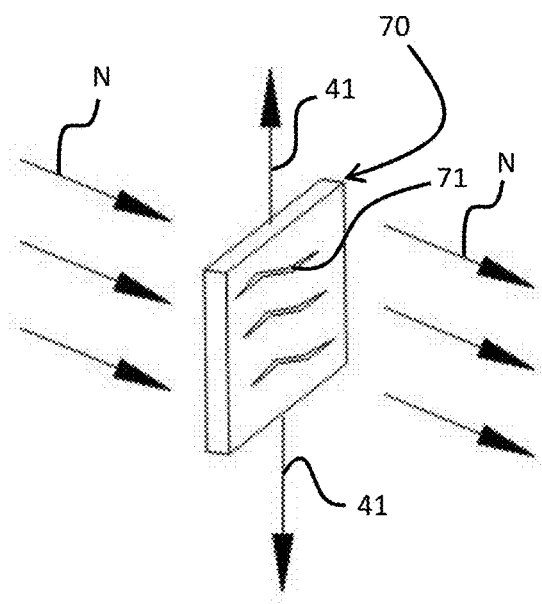

FIGS. 6A and 6B show a conventional laminated layer 70, both under no stress and under shear stress 41. As has been discussed, when a laminated layer 70 is placed under shear stress 41, micro-fractures 71 will develop, generally transverse to the direction of the shear stress 41. This allows egress noise N to transmit through the layer 70. Various methods of treating, aligning, orienting, and bonding layers has been discussed. The layers can also be textured in different ways.

Figure 6C:
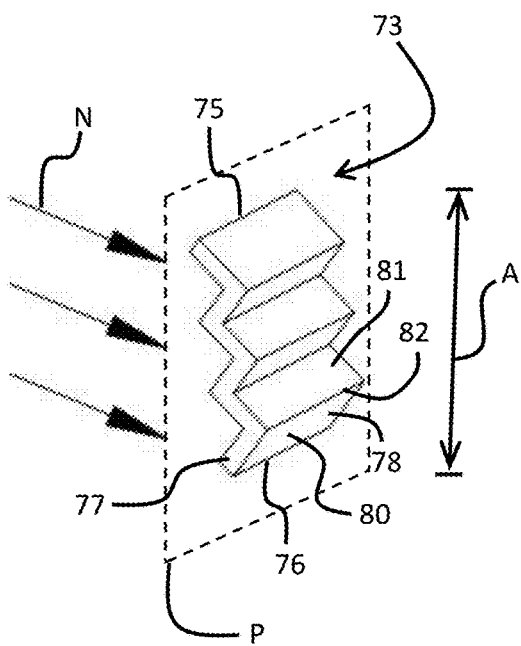
FIGS. 6C and 6D are diagrams of a layer of shielding tape with ridges, preventing the development of micro-fractures when placed under stress.
Figure 6D:
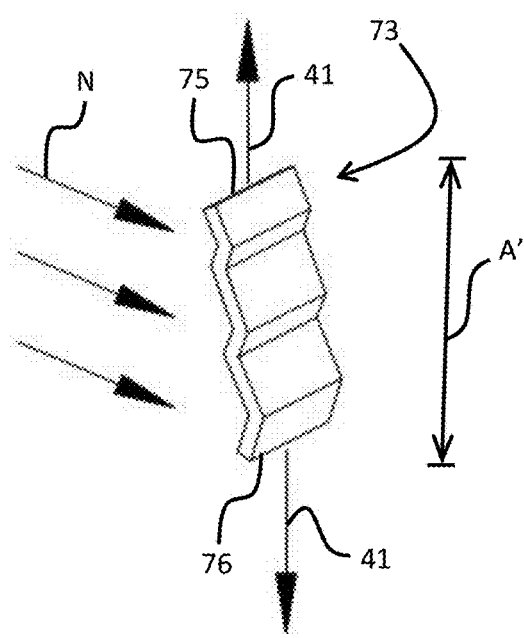

FIGS. 6C and 6D illustrate a single laminated metallic layer 73 of shielding tape, where the layer has a texture. The layer 73 is formed with a plurality of corrugations or ridges 74. The layer 73 has opposed ends 75 and 76 and opposed sides 77 and 78. Generally, the layer 73 is aligned along a plane P extending between the ends 75 and 76 and between the sides 77 and 78. The ridges 74, extending between the sides 77 and 78, project into and out of that plane. Each ridge 74 has a first wall 80 and a second wall 81, meeting at a hinge point 82 therebetween. The first and second walls 80 and 81 are generally straight and flat and oriented obliquely with respect to each other. The layer 73 has a dimension A between the opposed ends 75 and 76. When the layer 73 is placed under the shear stress 41, the layer 73 acquires a new dimension A'. Generally, because that shear stress 41 will be positive to act to extend the layer 73, the dimension A' is greater than the dimension A. However, in some cases, the shear stress 41 will be negative and will cause the ends 75 and 76 to collapse toward each other, in which case the dimension A' will be less than the dimension A. When the layer 73 is under a positive shear stress 41, the ridges 74 respond by flattening and lengthening. This accommodates the effect of the shear stress 41 to stretch the layer 73. Without such accommodation, the layer 73 would tend to tear and develop micro-fractures. In other words, the ridges 74 prevent or mitigate the development of micro-fractures.

The layer 73 is suitable for use as the sole layer in a shielding tape, or it may be used without similar layers 73, or with other different layers discussed herein, in different orientations described herein and with different surface treatments described herein.

FIGS. 6E and 6F show a metallic layer 84 of a shielding tape with waffling 85 formed by intersecting ridges 86 separated and spaced apart by depressions 87. The ridges 86 are oriented normally with respect to a plane in which the layer 84 lies, and there are two sets of ridges 86: one set which is aligned vertically, or end-to-end, and another set which is aligned horizontally, or side-to-side, so that the two sets of ridges are transverse and preferably perpendicular with respect to each other across both sides of the layer 84. The ridges 86 project normally to the layer 84, both in front of and behind the layer 84, and the depressions 87 are disposed between the ridges 86.

The ridges 86 are reinforced portions of the layer 84, representing a thickened portion of the layer 84, while the depressions 87 are "thinned" portions, in that they are thinner than the ridges 86, but are still generally as thick as the other layers, such as layers 50, 51, 52, 70, etc. When the shear stress 41 is applied to the layer 84 and it stretches, the ridges 86 respond by stretching slightly, and the depressions 87 respond by stretching slightly. Should a micro-fracture occur, it generally forms in the thinned area of a depression 87, and it is limited to the depression 87 in which it forms; it is unlikely to propagate through a ridge 86 to an adjacent depression 87. As such, the layer 84 prevents and mitigates the development of micro-fractures.

The layer 84 is suitable for use as the sole layer in a shielding tape, or it may be used without similar layers 84, or with other different layers discussed herein, in different orientations described herein and with different surface treatments described herein.

FIGS. 6G and 6H show another metallic layer 90 of a shielding tape with a plurality of dimples or concavities 91 formed therein and arranged in an array. These concavities 91 alleviate any stresses present and decrease the likelihood that stresses will cause a micro-fracture. Moreover, where stresses do cause a micro-fracture, such concavities 91 prevent and limit further expansion of the micro-fractures beyond the concavity 91. The concavities 91 thus act as a stop to migration or extension of micro-fractures across more of the layer 90.

Each concavity 91 is a semi-spherical concave depression, extending into the body of the layer 90. The concavities 91 all have a major dimension corresponding to the diameter of the semi-spherical depression. In the array of concavities 91 in the layer 90, the concavities 91 are arranged in rows, and the concavities 91 in each row are offset horizontally from those in the row above and below. The concavities 91 are preferably but not necessarily spaced apart by at least the major dimension. The concavities 91 preferably have a circular shape, with their major dimension being a diameter, but in other embodiments may have other shapes. When the shear stress 41 is applied, the layer 90 stretches along the direction of the shear stress 41 and the concavities 91 deform. Because the concavities 91 are semi-spherical, they can expand. They have more surface area than their cross-sectional circular outline circumscribes, and that surface area is stretched out when the layer 90 stretches under the shear stress 41. When the shear stress 41 is released, the concavities 91 return to their original shape, as in FIG. 6G.

The layer 90 is suitable for use as the sole layer in a shielding tape, or it may be used without similar layers 90, or with other different layers discussed herein, in different orientations described herein and with different surface treatments described herein.

As noted above, an elastomeric adhesive may be used between layers of the shielding tape. The elastomeric adhesive has elastomeric characteristics. The adhesive may be alternately formulated, however, to include metallic solids. An adhesive containing metallic solids may be elastomeric or non-elastomeric.

Figure 7A:
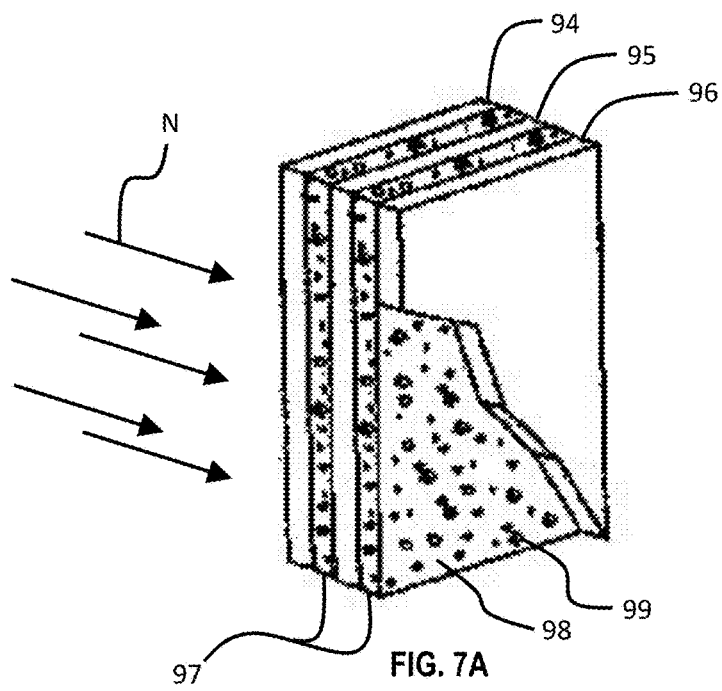
FIG. 7A is a diagram of layers of shielding tape with electrically-conductive adhesive disposed between the layers.

In FIG. 7A, three layers 94, 95, and 96 are shown, each with an electrically-conductive adhesive 97 disposed between. The adhesive 97 preferably but not necessarily includes the elastomeric adhesive 98 and small metallic solids 99 dispersed throughout the adhesive 98. In some embodiments, the adhesive 97 includes the metallic solids 99 and a non-elastomeric adhesive 98. The metallic solids 99 include aluminum, nickel, copper, carbon, graphene, or other like metals having good electrical conductivity properties, and range in size as small as only a few microns, such as just two or three microns in dimension, though they are illustrated in these drawings as much bigger for clarity only. The metallic solids 99 are homogenously dispersed and have a high density within the adhesive 97 to prevent transmission of very high frequency RF ingress or egress signals, and the conductivity (and thus noise mitigation properties) of the adhesive 97 improves with greater density of metallic solids 99 through quantum tunneling effects. RF signal or noise ingress or egress through the adhesive bond between the layers 94, 95, and 96 is effectively minimized by means of the electrically conductive adhesive 97. The dispersion of metallic solids 99 in the adhesive 97 enhances shielding effectiveness, and the adhesive 97 itself is thereby made to serve as a barrier to RF signals, sometimes without the need for an additional layer of laminate material or metallic layer. If or where micro-fractures develop in the layers 94, 95, and 96, the electrically-conductive adhesive 97 mitigates the transmission of egress noise N.

Figure 7B:
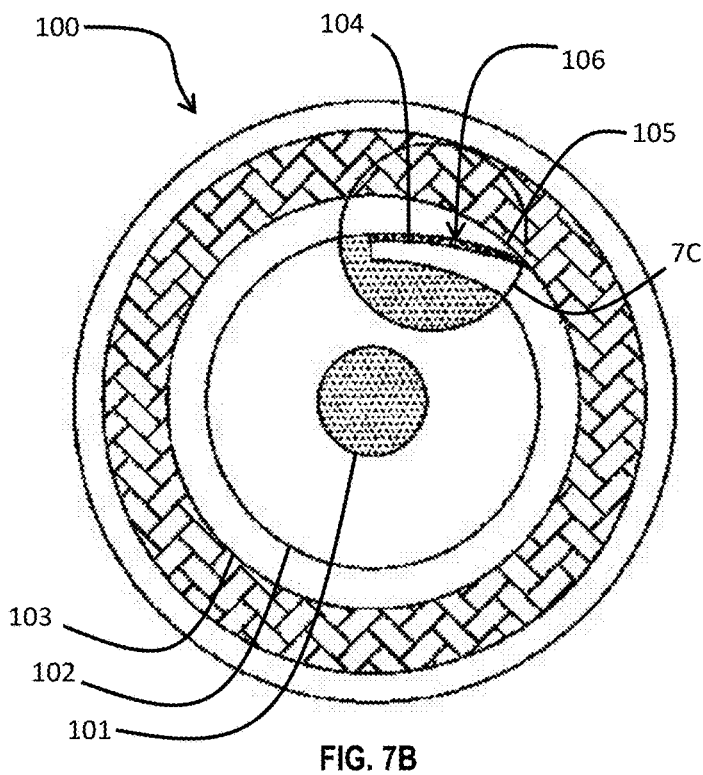
FIGS. 7B and 7C are section and detailed views of a coaxial cable, showing electrically-conductive adhesive disposed within an overlap gap in shielding tape.
Figure 7C:
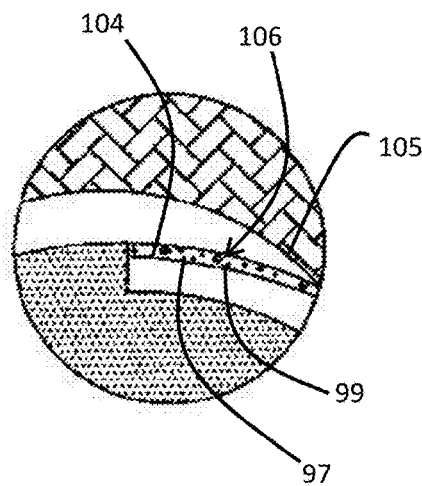

The electrically-conductive adhesive 97 is used in another context as well. FIGS. 7B and 7C illustrate an exemplary electronic cable 100 having a center conductor 101, a dielectric insulator 102 surrounding the center conductor 101, and shielding tape 103 wrapped around the insulator 102. The shielding tape 103 has opposed edges 104 and 105. The edges 104 and 105 overlap slightly to form an overlap gap 106. The electrically-conductive adhesive 97 is disposed in this overlap gap 106. The adhesive 97, dispersed with metallic solids 99, bonds the edges 104 and 105 to each other to prevent the shielding tape 103 from separating. However, the electrically-conductive adhesive 97 also prevents the gap 106 from becoming a tunnel for RF signal or noise ingress and egress.

It is noted that these methods, features, structures, and construction techniques can be combined. For example, the shielding tape 113 of FIG. 1C may have a layer with waffling, that layer may be elastomerically bonded at the edges, and an electrically-conductive adhesive may be used within an overlap gap when the shielding tape 113 is wrapped around the dielectric 112. Other combinations of the above mitigation features are contemplated as well.

A preferred embodiment is fully and clearly described above so as to enable one having skill in the art to understand, make, and use the same. Those skilled in the art will recognize that modifications may be made to the description above without departing from the spirit of the invention, and that some embodiments include only those elements and features described, or a subset thereof. To the extent that modifications do not depart from the spirit of the invention, they are intended to be included within the scope thereof.

The invention claimed is:

1. Shielding tape in an electronic cable, the shielding tape comprising:
   a first metallic layer having a first orientation along which micro-fractures are predisposed to form;
   a second metallic layer having a second orientation along which micro-fractures are predisposed to form; and
   the first and second orientations have a non-zero transverse relation with respect to each other.

2. The shielding tape of claim 1, wherein the first and second orientations in the first and second metallic layers are formed by burnishing the first and second metallic layers.

3. The shielding tape of claim 1, wherein the first metallic layer is arranged with a non-zero transverse orientation with respect to the second metallic layer.

* * * * *